(12) United States Patent
Shima et al.

(10) Patent No.: US 7,923,625 B2
(45) Date of Patent: Apr. 12, 2011

(54) STACKED PHOTOVOLTAIC DEVICE AND METHOD OF MANUFACTURING THE SAME

(75) Inventors: Masaki Shima, Uji (JP); Kunimoto Ninomiya, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 715 days.

(21) Appl. No.: 11/307,956

(22) Filed: Feb. 28, 2006

(65) Prior Publication Data

US 2006/0207648 A1   Sep. 21, 2006

(30) Foreign Application Priority Data

Feb. 28, 2005   (JP) ................................ 2005-054963

(51) Int. Cl.
    *H01L 31/00* (2006.01)
(52) U.S. Cl. ........ 136/255; 136/244; 136/251; 136/257; 136/258; 136/261
(58) Field of Classification Search .................. 136/244, 136/251, 255, 257, 258, 261
    See application file for complete search history.

(56) References Cited

U.S. PATENT DOCUMENTS

| | | | | |
|---|---|---|---|---|
| 4,591,892 A * | 5/1986 | Yamazaki | ...................... | 257/458 |
| 4,878,097 A | 10/1989 | Yamazaki et al. | | |
| 4,903,102 A | 2/1990 | Yamazaki | | |
| 6,399,873 B1 | 6/2002 | Sano et al. | | |
| 6,835,888 B2 | 12/2004 | Sno et al. | | |
| 6,858,308 B2 * | 2/2005 | Kondo et al. | .................. | 428/446 |
| 2002/0011264 A1 * | 1/2002 | Saito | .............................. | 136/258 |
| 2003/0079771 A1 | 5/2003 | Sano et al. | | |
| 2003/0213515 A1 | 11/2003 | Sano et al. | | |
| 2005/0028860 A1 | 2/2005 | Sano et al. | | |

FOREIGN PATENT DOCUMENTS

| | | |
|---|---|---|
| JP | 60218879 | 11/1985 |
| JP | 07169985 | 7/1995 |
| JP | 11-243218 | 9/1999 |
| JP | 2002231985 | 8/2002 |
| WO | WO 94/14199 A | 6/1994 |

OTHER PUBLICATIONS

Search report issued on May 24, 2006 in the counterpart European applicaiton.
"Double-Junction amorphous silicon-based solar cells with 11% stable efficiency" Applied Physics Letters, vol. 61, No. 24, Yang J et al. (XP000335207), Dec. 14, 1992.
Notice of Reasons for Refusal in the Counterpart Japanese Patent Application 2005-054963.
Chinese Office Action, May 8, 2009; English translation included.

* cited by examiner

*Primary Examiner* — Basia Ridley
*Assistant Examiner* — Thanh-Truc Trinh
(74) *Attorney, Agent, or Firm* — NDQ&M Watchstone LLP

(57) ABSTRACT

A back metal electrode, a bottom cell using microcrystalline silicon for a photoelectric conversion layer, a front cell using amorphous silicon for a photoelectric conversion layer, and a transparent front electrode are formed in this order on a supporting substrate. At least one of the concentration of impurities contained in the front photoelectric conversion layer and the concentration of impurities contained in the bottom photoelectric conversion layer is controlled such that the concentration of impurities in the bottom photoelectric conversion layer is higher than the concentration of impurities in the front photoelectric conversion layer. Impurities do not include a p-type dopant or an n-type dopant but are any one, two, or all of carbon, nitrogen, and oxygen.

10 Claims, 1 Drawing Sheet

F I G. 1
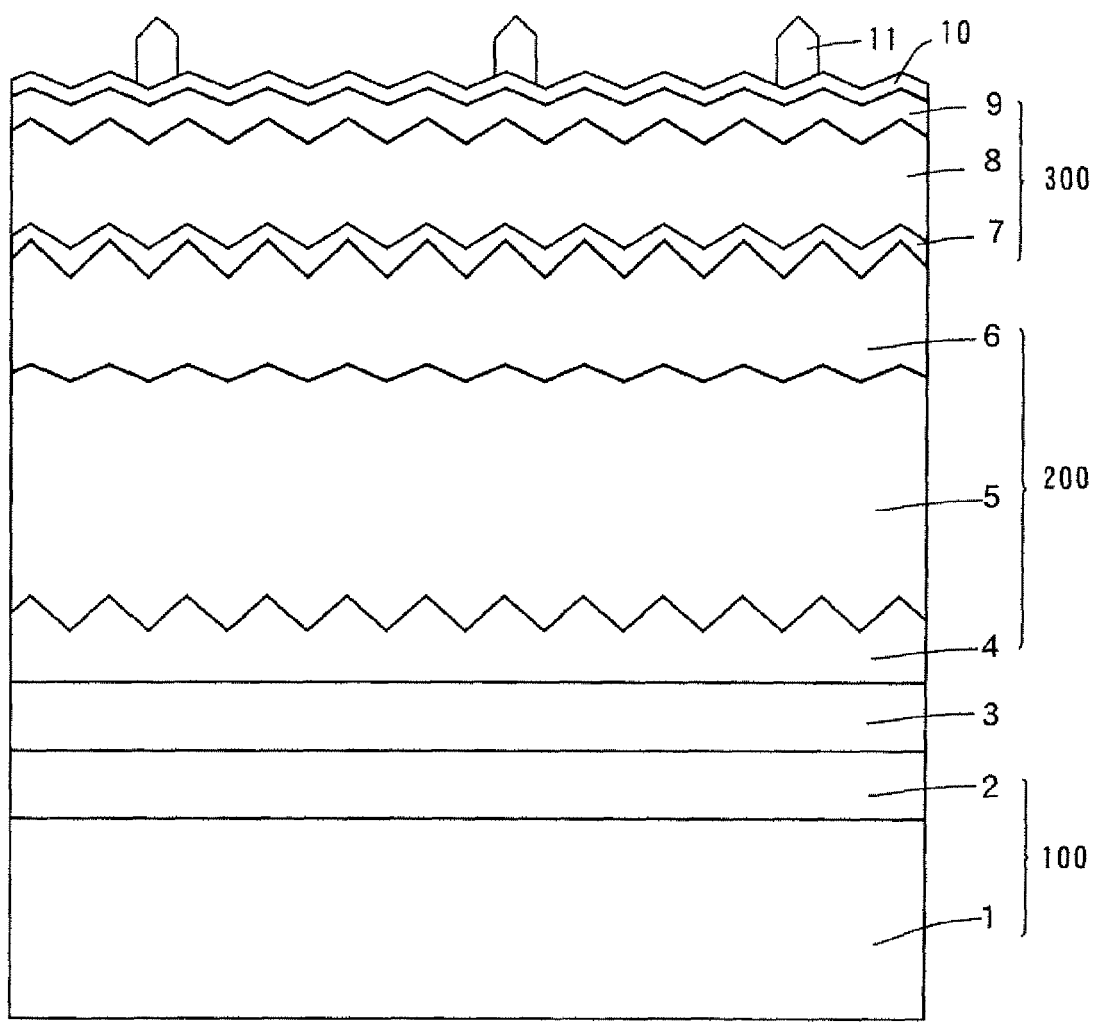

STACKED PHOTOVOLTAIC DEVICE AND METHOD OF MANUFACTURING THE SAME

BACKGROUND OF THE INVENTION

1. Field of the Invention

The present invention relates to a stacked photovoltaic device having a plurality of photovoltaic cells each comprising a photoelectric conversion layer composed of a non-single crystalline semiconductor stacked therein and a method of manufacturing the same.

2. Description of the Background Art

In recent years, photovoltaic cells using thin film-based semiconductors such as amorphous silicon for photoelectric conversion layers have been developed. Amorphous silicon has features of abounding in raw materials, being low in manufacturing energy and manufacturing cost, making a wide variety of supporting substrates usable, making high voltages extractable, and easily increasing in area. On the contrary, the photovoltaic cells using amorphous silicon (hereinafter referred to as amorphous-based photovoltaic cells) are more greatly light-degraded, so that they have lower photoelectric conversion efficiencies, as compared with crystal-based photovoltaic cells.

On the other hand, photovoltaic cells using microcrystalline silicon for photoelectric conversion layers have been developed. The photovoltaic cells using microcrystalline silicon (hereinafter referred to as microcrystal-based photovoltaic cells) have photoelectric conversion efficiencies that are less reduced by light degradation and can absorb light in wider wavelength ranges, as compared with amorphous-based photovoltaic cells. In the microcrystal-based photovoltaic cells, therefore, photoelectric conversion efficiencies can be improved.

Stacked photovoltaic devices having amorphous-based photovoltaic cells and microcrystal-based photovoltaic cells stacked therein (tandem type photovoltaic devices or hybrid solar cells) have been developed (see JP 11-243218 A, for example). In the stacked photovoltaic devices, amorphous-based photovoltaic cells are arranged on the side of light incidence, microcrystal-based photovoltaic cells are arranged below the amorphous-based photovoltaic cells, and the amorphous-based photovoltaic cells and the microcrystal-based photovoltaic cells are connected in series. Such stacked photovoltaic devices can receive optical spectra in wide regions, so that photoelectric conversion efficiencies are improved. Consequently, the stacked photovoltaic devices are promising as high efficiency thin film solar cells for power use.

In the stacked photovoltaic devices, however, the amorphous-based photovoltaic cells are more greatly light-degraded by light irradiation, as compared with the microcrystal-based photovoltaic cells. Therefore, balances between the output characteristics of the amorphous-based photovoltaic cells and the output characteristics of the microcrystal-based photovoltaic cells are disrupted, so that the output characteristics of the whole stacked photovoltaic devices are deteriorated. As a result, the total power generations are low as observed in the long term.

SUMMARY OF THE INVENTION

An object of the present invention is to provide a stacked photovoltaic device having output characteristics after light degradation whose reduction is restrained and a method of manufacturing the same.

An intrinsic semiconductor in the specification is a semiconductor in which an n-type dopant or a p-type dopant is not intentionally doped, and covers a semiconductor including an n-type dopant or a p-type dopant inherently included in a raw material for the semiconductor or an n-type dopant or a p-type dopant naturally contained in the manufacturing process.

In the following description, impurities refer to impurities other than elements serving as a donor or an acceptor.

A stacked photovoltaic device having a light incidence surface according to an aspect of the present invention comprises a plurality of photovoltaic cells stacked and each including a photoelectric conversion layer composed of a substantially intrinsic semiconductor, the photoelectric conversion layer in the one photovoltaic cell closest to the light incidence surface including an amorphous semiconductor, the photoelectric conversion layer in another photovoltaic cell including a non-single crystalline semiconductor containing crystal grains, and the concentration of impurities contained in the photoelectric conversion layer in the other photovoltaic cell is higher than the concentration of impurities contained in the photoelectric conversion layer in the one photovoltaic cell.

In the stacked photovoltaic device, the photoelectric conversion layer in the one photovoltaic cell closest to the light incidence surface includes the amorphous semiconductor, and the photoelectric conversion layer in the other photovoltaic cell includes the non-single crystalline semiconductor containing the crystal grains. Since an optical spectrum in a wide region can be received, therefore, the photoelectric conversion efficiency is improved.

The concentration of impurities contained in the photoelectric conversion layer in the other photovoltaic cells is higher than the concentration of impurities contained in the photoelectric conversion layer in the one photovoltaic cell closest to the light incidence surface. Thus, light degradation of the one photovoltaic cell and light degradation of the other photovoltaic cell by light irradiation are balanced. As a result, deterioration of the output characteristics of the whole stacked photovoltaic device by long-term use is restrained, so that the long-term power generation thereof is improved.

The non-single crystalline semiconductor may be a microcrystalline semiconductor containing crystal grains having a diameter of not more than 1 μm. In this case, the photoelectric conversion layer in the second or subsequent photovoltaic cell from the side of the light incidence surface comprise the microcrystalline semiconductor, so that the light degradation thereof is little. Consequently, the light degradation of the whole stacked photovoltaic cell by light irradiation is sufficiently restrained.

It is preferable that the impurities include carbon, and the concentration of carbon contained in the photoelectric conversion layer in the other photovoltaic cell is higher than the concentration of carbon contained in the photoelectric conversion layer in the one photovoltaic cell. Thus, the light degradation of the one photovoltaic cell and the light degradation of the other photovoltaic cell by light irradiation are balanced.

It is preferable that the impurities include nitrogen, and the concentration of nitrogen contained in the photoelectric conversion layer in the other photovoltaic cell is higher than the concentration of nitrogen contained in the photoelectric conversion layer in the one photovoltaic cell. Thus, the light degradation of the one photovoltaic cell and the light degradation of the other photovoltaic cell by light irradiation are balanced.

It is preferable that the impurities include oxygen, and the concentration of oxygen contained in the photoelectric conversion layer in the other photovoltaic cell is higher than the concentration of oxygen contained in the photoelectric conversion layer in the one photovoltaic cell. Thus, the light degradation of the one photovoltaic cell and the light degradation of the other photovoltaic cell by light irradiation are balanced.

A method of manufacturing a stacked photovoltaic device according to another aspect of the present invention, comprising the step of forming a plurality of photovoltaic cells each comprising a photoelectric conversion layer composed of a substantially intrinsic semiconductor in order, the photoelectric conversion layer in the one photovoltaic cell closest to a light incidence surface including an amorphous semiconductor, and the photoelectric conversion layer in another photovoltaic cell including a non-single crystalline semiconductor containing crystal grains; and adjusting at least one of the formation condition of the photoelectric conversion layer in the one photovoltaic cell and the formation condition of the photoelectric conversion layer in the other photovoltaic cell such that the concentration of impurities contained in the photoelectric conversion layer in the other photovoltaic cell is higher than the concentration of impurities contained in the photoelectric conversion layer in the one photovoltaic cell.

According to the method of manufacturing the stacked photovoltaic device, the photoelectric conversion layer in the one photovoltaic cell closest to the light incidence surface comprises the amorphous semiconductor, and the photoelectric conversion layer in the other photovoltaic cell comprises the non-single crystalline semiconductor containing crystal grains. Since an optical spectrum in a wide region can be received, therefore, the photoelectric conversion efficiency is improved.

The concentration of impurities contained in the photoelectric conversion layer in the other photovoltaic cells is higher than the concentration of impurities contained in the photoelectric conversion layer in the one photovoltaic cell closest to the light incidence surface. Thus, the light degradation of the one photovoltaic cell and the light degradation of the other photovoltaic cell by light irradiation are balanced. As a result, deterioration of the output characteristics of the whole stacked photovoltaic device by long-term use is restrained, so that the long-term power generation is improved.

The non-single crystalline semiconductor may be a microcrystalline semiconductor containing crystal grains having a diameter of not more than 1 μm. In this case, the photoelectric conversion layer in the second or subsequent photovoltaic cell from the side of the light incidence surface comprises the microcrystalline semiconductor, so that the light degradation thereof is little. Consequently, the light degradation of the whole stacked photovoltaic cell by light irradiation is sufficiently restrained.

The impurities may include carbon, and the adjusting step may comprise the step of adjusting at least one of the formation condition of the photoelectric conversion layer in the one photovoltaic cell and the formation condition of the photoelectric conversion layer in the other photovoltaic cell such that the concentration of carbon contained in the photoelectric conversion layer in the other photovoltaic cell is higher than the concentration of carbon contained in the photoelectric conversion layer in the one photovoltaic cell.

Thus, the light degradation of the one photovoltaic cell and the light degradation of the other photovoltaic cell by light irradiation are balanced.

The impurities may include nitrogen, and the adjusting step may comprise the step of adjusting at least one of the formation condition of the photoelectric conversion layer in the one photovoltaic cell and the formation condition of the photoelectric conversion layer in the other photovoltaic cell such that the concentration of nitrogen contained in the photoelectric conversion layer in the other photovoltaic cell is higher than the concentration of nitrogen contained in the photoelectric conversion layer in the one photovoltaic cell.

Thus, the light degradation of the one photovoltaic cell and the light degradation of the other photovoltaic cell by light irradiation are balanced.

The impurities may include oxygen, and the adjusting step may comprise the step of adjusting at least one of the formation condition of the photoelectric conversion layer in the one photovoltaic cell and the formation condition of the photoelectric conversion layer in the other photovoltaic cell such that the concentration of oxygen contained in the photoelectric conversion layer in the other photovoltaic cell is higher than the concentration of oxygen contained in the photoelectric conversion layer in the one photovoltaic cell.

Thus, the light degradation of the one photovoltaic cell and the light degradation of the other photovoltaic cell by light irradiation are balanced.

Other features, elements, characteristics, and advantages of the present invention will become more apparent from the following description of preferred embodiments of the present invention with reference to the attached drawings.

BRIEF DESCRIPTION OF THE DRAWINGS

FIG. 1 is a schematic sectional view showing the configuration of a stacked photovoltaic device according to an embodiment of the present invention.

DESCRIPTION OF THE PREFERRED EMBODIMENTS

Embodiment

FIG. 1 is a schematic sectional view showing the configuration of a stacked photovoltaic device according to an embodiment of the present invention.

As shown in FIG. 1, a back metal electrode 3, a microcrystal-based photovoltaic cell (hereinafter referred to as a bottom cell) 200 using microcrystalline silicon for a photoelectric conversion layer (a power generation layer), an amorphous-based photovoltaic cell (hereinafter referred to as a front cell) 300 using amorphous silicon for a photoelectric conversion layer, and a transparent front electrode 10 are formed in this order on a substrate 100. A collection grid electrode 11 is formed on the transparent front electrode 10.

The supporting substrate 100 has a stacked structure of a stainless plate 1 and a polyimide resin layer 2. The back metal electrode 3 is composed of Au (gold), Ag (silver), Al (aluminum), Cu (copper), Ti (titanium), W (tungsten), Ni (nickel), etc. In the present embodiment, Ag is used for the back metal electrode 3.

The bottom cell 200 comprises an n-layer 4 composed of an n-type hydrogenated microcrystalline silicon film (n-type μc-Si:H), a bottom photoelectric conversion layer 5 composed of an intrinsic (i-type) hydrogenated microcrystalline silicon film (i-type μc-Si:H), and a p-layer 6 composed of a p-type hydrogenated microcrystalline silicon film (p-type μc-Si:H) in this order.

The front cell 300 comprises an n-layer 7 composed of an n-type hydrogenated microcrystalline silicon film (n-type μc-Si:H), a front photoelectric conversion layer 8 composed of an intrinsic (i-type) hydrogenated amorphous silicon film (i-type a-Si:H), and a p-layer 9 composed of a p-type hydrogenated amorphous silicon carbide film (p-type a-SiC:H) in this order.

The transparent front electrode 10 is composed of a metal oxide such as ITO (indium tin oxide), $SnO_2$ (tin oxide), or ZnO (zinc oxide). In the stacked photovoltaic device shown in FIG. 1, the transparent front electrode 10 serves as a light receiving surface. In the present embodiment, ITO is used for the transparent front electrode 10.

The back metal electrode 3 and the transparent front electrode 10 are formed by a sputtering method, for example. The bottom cell 200 and the front cell 300 are formed by a plasma CVD (Chemical Vapor Deposition) method, for example.

In the present embodiment, at least one of the concentration of impurities contained in the front photoelectric conversion layer 8 and the concentration of impurities contained in the bottom photoelectric conversion layer 5 are controlled such that the concentration of impurities in the bottom photoelectric conversion layer 5 is higher than the concentration of impurities in the front photoelectric conversion layer 8. Here, impurities are any one, two, or all of carbon, nitrogen, and oxygen.

At least one of the concentration of carbon contained as impurities in the front photoelectric conversion layer 8 and the concentration of carbon contained as impurities in the bottom photoelectric conversion layer 5 are controlled such that the concentration of carbon in the bottom photoelectric conversion layer 5 is higher than the concentration of carbon in the front photoelectric conversion layer 8. Alternatively, at least one of the concentration of nitrogen contained as impurities in the front photoelectric conversion layer 8 and the concentration of nitrogen contained as impurities in the bottom photoelectric conversion layer 5 are controlled such that the concentration of nitrogen in the bottom photoelectric conversion layer 5 is higher than the concentration of nitrogen in the front photoelectric conversion layer 8. Alternatively, at least one of the concentration of oxygen contained as impurities in the front photoelectric conversion layer 8 and the concentration of oxygen contained as impurities in the bottom photoelectric conversion layer 5 are controlled such that the concentration of oxygen in the bottom photoelectric conversion layer 5 is higher than the concentration of oxygen in the front photoelectric conversion layer 8.

The concentration of impurities in the front photoelectric conversion layer 8 can be controlled by adjusting reaction conditions at the time of formation of the front photoelectric conversion layer 8. For example, the concentration of impurities in the front photoelectric conversion layer 8 can be reduced by reducing reaction pressure at the time of formation of the front photoelectric conversion layer 8. The concentration of impurities in the front photoelectric conversion layer 8 can be reduced by reducing the amount of $H_2$ (a hydrogen gas) with which a raw material gas is diluted at the time of formation of the front photoelectric conversion layer 8.

The concentration of impurities in the bottom photoelectric conversion layer 5 can be controlled by adjusting reaction conditions at the time of formation of the bottom photoelectric conversion layer 5. For example, the concentration of impurities in the bottom photoelectric conversion layer 5 can be increased by increasing reaction pressure at the time of formation of the bottom photoelectric conversion layer 5. The concentration of impurities in the bottom photoelectric conversion layer 5 can be increased by increasing the amount of $H_2$ (a hydrogen gas) with which a raw material gas is diluted at the time of formation of the bottom photoelectric conversion layer 5.

In a case where the reaction pressure at the time of formation of the front photoelectric conversion layer 8 is low or a case where the amount of the hydrogen gas serving as a diluent gas is small, or a case where the high-frequency power is small, the deposition rate is reduced. Consequently, the density of silicon atoms mainly composing the front photoelectric conversion layer 8 is increased. As a result, impurities contained in very small amounts in the raw material gas are difficult to incorporate in the front photoelectric conversion layer 8, so that it is considered that the concentration of impurities in the front photovoltaic conversion layer 8 is reduced.

In a case where the reaction pressure at the time of formation of the bottom photoelectric conversion layer 5 is high, the deposition rate is increased. Consequently, the density of silicon atoms mainly composing the bottom photoelectric conversion layer 5 is reduced. As a result, impurities contained in very small amounts in the raw material gas are difficult to incorporate in the bottom photoelectric conversion layer 5, so that it is considered that the concentration of impurities in the bottom photovoltaic conversion layer 5 is increased.

In a case where the reaction pressure at the time of formation of the front photoelectric conversion layer 8 is low or a case where the amount of the hydrogen gas serving as a diluent gas is small, hydrogen radicals having a high concentration are prevented from turning out impurities adhering to an electrode of a CVD system or a wall of a reaction chamber. As a result, impurities are difficult to incorporate in the front photoelectric conversion layer 8, so that it is considered that the concentration of impurities in the front photovoltaic conversion layer 8 is reduced.

On the other hand, in a case where the reaction pressure at the time of formation of the bottom photoelectric conversion layer 5 is high or a case where the amount of the hydrogen gas serving as a diluent gas is large, hydrogen radicals having a high concentration are prevented from turning out impurities adhering to an electrode of a CVD system or a wall of a reaction chamber. As a result, impurities are easy to incorporate in the bottom photoelectric conversion layer 5, so that it is considered that the concentration of impurities in the bottom photovoltaic conversion layer 5 is increased.

The respective concentrations of impurities in the bottom photoelectric conversion layer 5 and the front photoelectric conversion layer 8 can be also controlled such that the concentration of impurities in the bottom photoelectric conversion layer 5 is higher than the concentration of impurities in the front photoelectric conversion layer 8 by introducing a gas containing carbon, nitrogen, or oxygen in very small amounts when the bottom photoelectric conversion layer 5 and the front photoelectric conversion layer 8 are formed.

The concentration of carbon in the bottom photoelectric conversion layer 5 can be made higher than the concentration of carbon in the front photoelectric conversion layer 8 by adding $CH_4$ (methane) in very small amounts to $SiH_4$ (silane) serving as a raw material gas as well as adjusting the amount of the addition when the bottom photoelectric conversion layer 5 and the front photoelectric conversion layer 8 are formed, for example.

The concentration of nitrogen in the bottom photoelectric conversion layer 5 can be made higher than the concentration of nitrogen in the front photoelectric conversion layer 8 by adding $NH_3$ (ammonia), or both $NH_3$ and $H_2$ in very small amounts to $SiH_4$ serving as a raw material gas as well as adjusting the amount of the addition when the bottom photoelectric conversion layer 5 and the front photoelectric conversion layer 8 are formed.

Furthermore, the concentration of oxygen in the bottom photoelectric conversion layer 5 can be made higher than the concentration of oxygen in the front photoelectric conversion layer 8 by adding $CO_2$ (carbon dioxide) in very small amounts to $SiH_4$ serving as a raw material gas as well as adjusting the amount of the addition when the bottom photoelectric conversion layer 5 and the front photoelectric conversion layer 8 are formed.

A method of manufacturing a stacked photovoltaic device according to the present embodiment will be then described.

First, a supporting substrate 100 is prepared, which comprises a polyimide resin film 2 having a thickness of approximately 20 μm obtained by vapor deposition polymerization on a stainless plate 1 such as SUS 430 having a thickness of 0.15 mm, for example.

A back metal electrode 3 composed of Ag having a thickness of approximately 200 nm is then formed on the supporting substrate 100 using an RF (high-frequency) magnetron sputtering method.

Thereafter, gases are successively introduced into a reaction chamber in a CVD system, to form a bottom cell 200 and a front cell 300 by a plasma CVD method in the following manner. First, $SiH_4$, $H_2$, and $PH_3$ (phosphine) are introduced into the reaction chamber, to form an n-layer 4 having a thickness of 20 nm on the back metal electrode 3. Then, $SiH_4$ and $H_2$ are introduced into the reaction chamber, to form a bottom photoelectric conversion layer 5 having a thickness of 2 μm on the n-layer 4. Further, $SiH_4$, $H_2$, and $B_2H_6$ (diborane) are introduced into the reaction chamber, to form a p-layer 6 having a thickness of 20 nm on the bottom photoelectric conversion layer 5. Thus, the bottom cell 200 is formed.

Thereafter, $SiH_4$, $H_2$, and $PH_3$ are introduced into the reaction chamber, to form an n-layer 7 having a thickness of 20 nm on the p-layer 6. Then, $SiH_4$ is introduced into the reaction chamber, to form a front photoelectric conversion layer 8 having a thickness of 300 nm on the n-layer 7. Here, the concentration of carbon, the concentration of nitrogen and the concentration of oxygen in the front cell 300 are controlled by adjusting reaction pressure, high-frequency power, and a gas flow rate. Further, $SiH_4$, $H_2$, $CH_4$, and $B_2H_6$ are introduced into the reaction chamber, to form a p-layer 9 having a thickness of 20 nm on the front photoelectric conversion layer 8. Thus, the front cell 300 is formed.

A transparent front electrode 10 composed of ITO having a thickness of approximately 80 nm is then formed on the p-layer 9 using an RF magnetron sputtering method. Finally, a collection grid electrode 11 composed of Ag is formed on the transparent front electrode 10 by a vapor deposition.

In the stacked photovoltaic device according to the present embodiment, the concentration of impurities in the bottom photoelectric conversion layer 5 is higher than the concentration of impurities in the front photoelectric conversion layer 8. Thus, light degradation of the front cell 300 and light degradation of the bottom cell 200 by light irradiation are balanced. As a result, deterioration of the output characteristics of the whole stacked photovoltaic device is restrained by long-term use, so that the low-term power generation is improved.

Another Modified Example

Although in the stacked photovoltaic device according to the above-mentioned embodiment, the one bottom cell 200 is provided between the supporting substrate 100 and the front cell 300, a plurality of bottom cells may be stacked between the supporting substrate 100 and the front cell 300. In the case, the same effect as that in the above-mentioned embodiment is also obtained. However, a photoelectric conversion layer in the first photovoltaic cell from the side of a light incidence surface is composed of amorphous silicon, and a photoelectric conversion layer in the second or subsequent photovoltaic cell is composed of microcrystalline silicon. The concentration of impurities in the photoelectric conversion layer in the second or subsequent photovoltaic cell must be higher than the concentration of impurities in the photoelectric conversion layer in the first photovoltaic cell.

Although in the above-mentioned embodiment, the supporting substrate 100 has a stacked structure of the stainless plate 1 and the polyimide resin layer 2, the present invention is not limited to the same. For example, the stainless plate 1 may be replaced with other metal plates composed of iron, molybdenum, aluminum, etc. or various types of alloy plates.

Furthermore, although in the above-mentioned embodiment, the polyimide resin layer 2 is used as an insulating layer for electrically separating the photovoltaic cell from such a metal plate or alloy plate, the present invention is not limited to the same. For example, the polyimide resin layer 2 may be replaced with another resin layer composed of PES (polyether sulfone) or the like or an insulating thin film composed of $SiO_2$ (silicon dioxide) or the like.

A combination of a material for the metal plate or the alloy plate composing the supporting substrate 100 and a material for the insulating layer is not limited. For example, a combination of arbitrary materials can be used.

Although in the above-mentioned embodiment, the surface of the supporting substrate 100 is formed so as to be flat, the surface of the supporting substrate 100 may have an irregular structure. For example, the surface of the supporting substrate 100 can be formed in an irregular shape by containing particles of $SiO_2$, $TiO_2$, etc. having a diameter of several micrometers in a resin layer such as the polyimide resin layer 2. In this case, light is scattered at the back of the stacked photovoltaic device, so that the effect of confining light is improved. Thus, the conversion efficiency can be further improved.

Although in the above-mentioned embodiment, an n-type hydrogenated microcrystalline silicon film is used as a semiconductor of one conductivity type and a p-type hydrogenated microcrystalline silicon film is used as a semiconductor of the other conductivity type in the bottom cell 200, and an n-type hydrogenated microcrystalline silicon film is used as a semiconductor of one conductivity type and a p-type hydrogenated amorphous silicon carbide film is used as a semiconductor of the other conductivity type in the front cell 300, the present invention is not limited to the same. For example, a p-type hydrogenated microcrystalline silicon film may be used as a semiconductor of one conductivity type and an n-type hydrogenated microcrystalline silicon film may be used as a semiconductor of the other conductivity type in the bottom cell 200, and a p-type hydrogenated microcrystalline silicon film may be used as a semiconductor of one conductivity type and an n-type hydrogenated amorphous silicon film may be used as a semiconductor of the other conductivity type in the front cell 300.

Furthermore, the crystalline properties of the other layers excluding the bottom photoelectric conversion layer 5 are not limited in the bottom cell 200. The n-layer 4 and the p-layer 6 may be composed of a microcrystalline silicon film, or may be composed of an amorphous silicon film.

Similarly, the crystalline properties of the other layers excluding the front photoelectric conversion layer 8 are not limited in the front cell 300. The n-layer 7 and the p-layer 9 may be composed of a microcrystalline silicon film, or may be composed of an amorphous silicon film.

Although in the above-mentioned embodiment, P (phosphorus) is used as an n-type dopant for the n-type layer 4 and the n-type layer 7, the present invention is not limited to the same. For example, a group V element such as (arsenic) may be used as an n-type dopant. Although in the present embodiment, B (boron) is used as a p-type dopant for the p-layer 6 and the p-layer 9, the present invention is not limited to the same. For example, a group III element such as Al (aluminum) or Ga (gallium) may be used as a p-type dopant.

EXAMPLES

In inventive examples 1 to 3, described below, stacked photovoltaic devices were formed by the method according to the above-mentioned embodiment, to measure the output characteristics and the impurity concentration thereof. In comparative examples 1 to 3, stacked photovoltaic devices were formed in the same method as that in the inventive examples except for the formation conditions of front photoelectric conversion layers 8, to measure the output characteristics and the impurity concentration thereof.

(1) Inventive Example 1 and Comparative Example 1

Table 1 shows the formation conditions of the stacked photovoltaic device in the inventive example 1, and Table 2 shows the formation conditions of the stacked photovoltaic device in the comparative example 1.

TABLE 1

| Inventive example 1 | | Substrate temperature [° C.] | Reaction pressure [Pa] | High-frequency power [W] | Gas flow rate [sccm] | |
|---|---|---|---|---|---|---|
| Bottom cell | n-layer | 160 | 133 | 100 | $SiH_4$ | 3 |
| | | | | | $H_2$ | 200 |
| | | | | | $PH_3$ | 0.6 |
| | Bottom photoelectric conversion layer | 200 | 133 | 30 | $SiH_4$ | 20 |
| | | | | | $H_2$ | 400 |
| | p-layer | 160 | 133 | 240 | $SiH_4$ | 10 |
| | | | | | $H_2$ | 2000 |
| | | | | | $B_2H_6$ | 0.2 |
| Front cell | n-layer | 160 | 133 | 100 | $SiH_4$ | 3 |
| | | | | | $H_2$ | 200 |
| | | | | | $PH_3$ | 0.6 |
| | Front photoelectric conversion layer | 160 | 11 | 5 | $SiH_4$ | 30 |
| | p-layer | 160 | 33 | 240 | $SiH_4$ | 10 |
| | | | | | $H_2$ | 90 |
| | | | | | $CH_4$ | 10 |
| | | | | | $B_2H_6$ | 0.4 |

TABLE 2

| Comparative example 1 | | Substrate temperature [° C.] | Reaction pressure [Pa] | High-frequency power [W] | Gas flow rate [sccm] | |
|---|---|---|---|---|---|---|
| Bottom cell | n-layer | 160 | 133 | 100 | $SiH_4$ | 3 |
| | | | | | $H_2$ | 200 |
| | | | | | $PH_3$ | 0.6 |
| | Bottom photoelectric conversion layer | 200 | 133 | 30 | $SiH_4$ | 20 |
| | | | | | $H_2$ | 400 |
| | p-layer | 160 | 133 | 240 | $SiH_4$ | 10 |
| | | | | | $H_2$ | 2000 |
| | | | | | $B_2H_6$ | 0.2 |

TABLE 2-continued

| Comparative example 1 | | Substrate temperature [° C.] | Reaction pressure [Pa] | High-frequency power [W] | Gas flow rate [sccm] | |
|---|---|---|---|---|---|---|
| Front cell | n-layer | 160 | 133 | 100 | $SiH_4$ | 3 |
| | | | | | $H_2$ | 200 |
| | | | | | $PH_3$ | 0.6 |
| | Front photoelectric conversion layer | 160 | 133 | 30 | $SiH_4$ | 30 |
| | | | | | $H_2$ | 75 |
| | p-layer | 160 | 33 | 240 | $SiH_4$ | 10 |
| | | | | | $H_2$ | 90 |
| | | | | | $CH_4$ | 10 |
| | | | | | $B_2H_6$ | 0.4 |

As shown in Table 1 and Table 2, reaction pressure and high-frequency power at the time of formation of the front photoelectric conversion layer 8 in the inventive example 1 were made lower than those in the comparative example 1. $H_2$ serving as a diluent gas was not introduced at the time of formation of the front photoelectric conversion layer 8 in the inventive example 1, and $H_2$ serving as a diluent gas was introduced at the time of formation of the front photoelectric conversion layer 8 in the comparative example 1.

The respective initial characteristics of the stacked photovoltaic devices in the inventive example 1 and the comparative example 1 were measured under conditions such as AM (Air Mass) of −1.5, 100 mW/cm², and 25° C. Thereafter, the stacked photovoltaic device in each of the inventive example 1 and the comparative example 1 was divided into two parts. One of the parts was used for evaluating characteristics after light irradiation, described later. In order to evaluate the concentration of carbon as the concentration of impurities within each of the bottom photoelectric conversion layer 5 and the front photoelectric conversion layer 8, the other part was analyzed by a secondary ion mass analyzer (SIMS; Secondary Ion Mass Spectroscopy).

First, Table 3 shows the results of the analysis by the SIMS. The analysis by the SIMS was carried out by using IMS-6F manufactured by CAMECA Instruments JAPAN KK and irradiating $Cs^+$ ions at an angle of incidence of 25 degrees at an acceleration voltage of 14.5 kV.

TABLE 3

| | Concentration of impurities (carbon) in front photoelectric conversion layer [atom/cm³] | Concentration of impurities (carbon) in bottom photoelectric conversion layer [atom/cm³] |
|---|---|---|
| Inventive example 1 | $6 \times 10^{17}$ | $4 \times 10^{18}$ |
| Comparative example 1 | $7 \times 10^{18}$ | $4 \times 10^{18}$ |

As shown in Table 3, the concentration of carbon in the bottom photoelectric conversion layer 5 in the inventive example 1 is approximately equal to that in the comparative example 1, while the concentration of carbon in the front photoelectric conversion layer 8 in the inventive example 1 is lower than that in the comparative example 1. Thus, the concentration of carbon in the bottom photoelectric conversion layer 5 is higher than the concentration of carbon in the front photoelectric conversion layer 8 in the inventive example 1. On the other hand, the concentration of carbon in the bottom photoelectric conversion layer 5 is lower than the concentration of carbon in the front photoelectric conversion layer 8 in the comparative example 1.

The results have shown that the concentration of carbon in the front photoelectric conversion layer 8 can be controlled by adjusting the formation conditions of the front photoelectric conversion layer 8.

Furthermore, in order to evaluate the conversion efficiency after stabilization by light irradiation for a long time period, light was irradiated for 160 minutes toward the respective other parts of the stacked photovoltaic devices in the inventive example 1 and the comparative example 1 under conditions such as AM-1.5, 500 mW/cm$^2$, 25° C., and an opened state between terminals. Standardized output characteristics were calculated by dividing the value of the output characteristics after light irradiation by the value of the initial characteristics before light irradiation. Table 4 shows the standardized conversion efficiency, standardized open-circuit voltage, standardized short-circuit current, and standardized fill factor (F. F.) as the standardized output characteristics.

TABLE 4

|  | Standardized conversion efficiency | Standardized open-circuit voltage | Standardized short-circuit current | Standardized fill factor |
|---|---|---|---|---|
| Inventive example 1 | 0.88 | 0.99 | 0.97 | 0.92 |
| Comparative example 1 | 0.81 | 0.98 | 0.97 | 0.85 |

The value of the standardized output characteristic is equal to the value of (1—light degradation factor). Consequently, the closer the value of the standardized output characteristic is to one, the less the light degradation is.

As shown in Table 4, it is found that the light degradation factor in the inventive example 1 is lower than that in the comparative example 1. The reason for this is considered as follows.

That is, the light degradation of the bottom photoelectric conversion layer 5 can be brought close to the light degradation of the front photoelectric conversion layer 8 by making the concentration of carbon in the bottom photoelectric conversion layer 5 higher than the concentration of carbon in the front photoelectric conversion layer 8, so that the light degradation of the bottom photoelectric conversion layer 5 and the light degradation of the front photoelectric conversion layer 8 are balanced. Therefore, the fill factor after light irradiation is kept high. Since the bottom photoelectric conversion layer 5 is composed of microcrystalline silicon, the light degradation thereof is inherently very little. In the stacked photovoltaic device, the bottom cell 200 and the front cell 300 are connected in series. In the comparative example 1, therefore, the balance between the output characteristics of the front cell 300 and the output characteristics of the bottom cell 200 is disrupted as the fill factor of the front cell 300 is reduced. Therefore it is considered that the fill factor of the whole stacked photovoltaic device was degraded. Contrary to this, in the inventive example 1, the output characteristics of the front cell 300 and the output characteristics of the bottom cell 200 are balanced in the inventive example 1, so that it is considered that the fill factor of the whole stacked photovoltaic device was also kept relatively high.

As a result of these, the output characteristics after the light degradation of the stacked photovoltaic device can be kept high by making the concentration of carbon in the bottom photoelectric conversion layer 5 higher than the concentration of carbon in the front photoelectric conversion layer 8.

(2) Inventive Example 2 and Comparative Example 2

Table 5 shows the formation conditions of the stacked photovoltaic device in the inventive example 2, and Table 6 shows the formation conditions of the stacked photovoltaic device in the comparative example 2.

TABLE 5

| Inventive example 2 | | Substrate temperature [° C.] | Reaction pressure [Pa] | High-frequency power [W] | Gas flow rate [sccm] | |
|---|---|---|---|---|---|---|
| Bottom cell | n-layer | 160 | 133 | 100 | SiH$_4$ | 3 |
|  |  |  |  |  | H$_2$ | 200 |
|  |  |  |  |  | PH$_3$ | 0.6 |
|  | Bottom photoelectric conversion layer | 200 | 133 | 30 | SiH$_4$ | 20 |
|  |  |  |  |  | H$_2$ | 400 |
|  | p-layer | 160 | 133 | 240 | SiH$_4$ | 10 |
|  |  |  |  |  | H$_2$ | 2000 |
|  |  |  |  |  | B$_2$H$_6$ | 0.2 |
| Front cell | n-layer | 160 | 133 | 100 | SiH$_4$ | 3 |
|  |  |  |  |  | H$_2$ | 200 |
|  |  |  |  |  | PH$_3$ | 0.6 |
|  | Front photoelectric conversion layer | 160 | 11 | 5 | SiH$_4$ | 30 |
|  | p-layer | 160 | 33 | 240 | SiH$_4$ | 10 |
|  |  |  |  |  | H$_2$ | 90 |
|  |  |  |  |  | CH$_4$ | 10 |
|  |  |  |  |  | B$_2$H$_6$ | 0.4 |

TABLE 6

| Comparative example 2 | | Substrate temperature [° C.] | Reaction pressure [Pa] | High-frequency power [W] | Gas flow rate [sccm] | |
|---|---|---|---|---|---|---|
| Bottom cell | n-layer | 160 | 133 | 100 | SiH$_4$ | 3 |
|  |  |  |  |  | H$_2$ | 200 |
|  |  |  |  |  | PH$_3$ | 0.6 |
|  | Bottom photoelectric conversion layer | 200 | 133 | 30 | SiH$_4$ | 20 |
|  |  |  |  |  | H$_2$ | 400 |
|  | p-layer | 160 | 133 | 240 | SiH$_4$ | 10 |
|  |  |  |  |  | H$_2$ | 2000 |
|  |  |  |  |  | B$_2$H$_6$ | 0.2 |
| Front cell | n-layer | 160 | 133 | 100 | SiH$_4$ | 3 |
|  |  |  |  |  | H$_2$ | 200 |
|  |  |  |  |  | PH$_3$ | 0.6 |
|  | Front photoelectric conversion layer | 160 | 266 | 30 | SiH$_4$ | 30 |
|  |  |  |  |  | H$_2$ | 90 |
|  | p-layer | 160 | 33 | 240 | SiH$_4$ | 10 |
|  |  |  |  |  | H$_2$ | 90 |
|  |  |  |  |  | CH$_4$ | 10 |
|  |  |  |  |  | B$_2$H$_6$ | 0.4 |

As shown in Table 5 and Table 6, reaction pressure and high-frequency power at the time of formation of the front photoelectric conversion layer 8 in the inventive example 2 were made lower than those in the comparative example 2. H$_2$ serving as a diluent gas was not introduced at the time of formation of the front photoelectric conversion layer 8 in the inventive example 2, and H$_2$ serving as a diluent gas was introduced at the time of formation of the front photoelectric conversion layer 8 in the comparative example 2.

The respective initial characteristics of the stacked photovoltaic devices in the inventive example 2 and the comparative example 2 were measured under conditions such as AM-1.5, 100 mW/cm$^2$, and 25° C. Thereafter, the stacked photovoltaic device in each of the inventive example 2 and the comparative example 2 was divided into two parts. One of the parts was used for evaluating characteristics after light irradiation, described later. In order to evaluate the concentration of nitrogen as the concentration of impurities in each of the bottom photoelectric conversion layer 5 and the front photoelectric conversion layer 8, the other part was analyzed by an SIMS.

First, Table 7 shows the results of the analysis by the SIMS.

TABLE 7

|  | Concentration of impurities (nitrogen) in front photoelectric conversion layer [atom/cm$^3$] | Concentration of impurities (nitrogen) in bottom photoelectric conversion layer [atom/cm$^3$] |
|---|---|---|
| Inventive example 2 | $6 \times 10^{16}$ | $1 \times 10^{17}$ |
| Comparative example 2 | $2 \times 10^{17}$ | $1 \times 10^{17}$ |

As shown in FIG. 7, the concentration of nitrogen in the bottom photoelectric conversion layer 5 in the inventive example 2 is approximately equal to that in the comparative example 2, while the concentration of nitrogen in the front photoelectric conversion layer 8 in the inventive example 2 is lower than that in the comparative example 2. Thus, the concentration of nitrogen in the bottom photoelectric conversion layer 5 is higher than the concentration of nitrogen in the front photoelectric conversion layer 8 in the inventive example 2. On the other hand, the concentration of nitrogen in the bottom photoelectric conversion layer 5 is lower than the concentration of nitrogen in the front photoelectric conversion layer 8 in the comparative example 2.

The results have shown that the concentration of nitrogen in the front photoelectric conversion layer 8 can be controlled by adjusting the formation conditions of the front photoelectric conversion layer 8.

Furthermore, in order to evaluate conversion efficiency after stabilization by light irradiation for a long time period, light was irradiated for 160 minutes toward the respective other parts of the stacked photovoltaic devices in the inventive example 2 and the comparative example 2 under conditions such as AM-1.5, 500 mW/cm$^2$, 25° C., and an opened state between terminals. Standardized output characteristics were calculated by dividing the value of the output characteristics after light irradiation by the value of the initial characteristics before light irradiation. Table 8 shows the standardized conversion efficiency, standardized open-circuit voltage, standardized short-circuit current, and standardized fill factor as the standardized output characteristics.

TABLE 8

|  | Standardized conversion efficiency | Standardized open-circuit voltage | Standardized short-circuit current | Standardized fill factor |
|---|---|---|---|---|
| Inventive example 2 | 0.88 | 0.99 | 0.98 | 0.91 |
| Comparative example 2 | 0.82 | 0.99 | 0.97 | 0.85 |

As shown in Table 4, it is found that the light degradation factor in the inventive example 2 is lower than that in the comparative example 2. The reason for this is considered as follows.

That is, the light degradation of the bottom photoelectric conversion layer 5 can be brought close to the light degradation of the front photoelectric conversion layer 8 by making the concentration of nitrogen in the bottom photoelectric conversion layer 5 higher than the concentration of nitrogen in the front photoelectric conversion layer 8, so that the light degradation of the bottom photoelectric conversion layer 5 and the light degradation of the front photoelectric conversion layer 8 are balanced. Therefore, the fill factor after light irradiation is kept high. Since the bottom photoelectric conversion layer 5 is composed of microcrystalline silicon, the light degradation thereof is inherently very little. In the stacked photovoltaic device, the bottom cell 200 and the front cell 300 are connected in series. In the comparative example 2, therefore, the balance between the output characteristics of the front cell 300 and the output characteristics of the bottom cell 200 is disrupted as the fill factor of the front cell 300 is reduced. Therefore, it is considered that the fill factor of the whole stacked photovoltaic device was degraded. Contrary to this, in the inventive example 2, the output characteristics of the front cell 300 and the output characteristics of the bottom cell 200 are balanced in the inventive example 1, so that it is considered that the fill factor of the whole stacked photovoltaic device was also kept relatively high.

As a result of these, the output characteristics after the light degradation of the stacked photovoltaic device can be kept high by making the concentration of nitrogen in the bottom photoelectric conversion layer 5 higher than the concentration of nitrogen in the front photoelectric conversion layer 8.

(3) Inventive Example 3 and Comparative Example 3

Table 9 shows the formation conditions of the stacked photovoltaic device in the inventive example 3, and Table 10 shows the formation conditions of the stacked photovoltaic device in the comparative example 3.

TABLE 9

| Inventive example 2 | | Substrate temperature [° C.] | Reaction pressure [Pa] | High-frequency power [W] | Gas flow rate [sccm] | |
|---|---|---|---|---|---|---|
| Bottom cell | n-layer | 160 | 133 | 100 | SiH$_4$<br>H$_2$<br>PH$_3$ | 3<br>200<br>0.6 |
| | Bottom photoelectric conversion layer | 200 | 133 | 30 | SiH$_4$<br>H$_2$ | 20<br>400 |
| | p-layer | 160 | 133 | 240 | SiH$_4$<br>H$_2$<br>B$_2$H$_6$ | 10<br>2000<br>0.2 |

TABLE 9-continued

| Inventive example 2 | | Substrate temperature [° C.] | Reaction pressure [Pa] | High-frequency power [W] | Gas flow rate [sccm] | |
|---|---|---|---|---|---|---|
| Front cell | n-layer | 160 | 133 | 100 | $SiH_4$ | 3 |
| | | | | | $H_2$ | 200 |
| | | | | | $PH_3$ | 0.6 |
| | Front photoelectric conversion layer | 160 | 11 | 5 | $SiH_4$ | 30 |
| | p-layer | 160 | 33 | 240 | $SiH_4$ | 10 |
| | | | | | $H_2$ | 90 |
| | | | | | $CH_4$ | 10 |
| | | | | | $B_2H_6$ | 0.4 |

TABLE 10

| Comparative example 3 | | Substrate temperature [° C.] | Reaction pressure [Pa] | High-frequency power [W] | Gas flow rate [sccm] | |
|---|---|---|---|---|---|---|
| Bottom cell | n-layer | 160 | 133 | 100 | $SiH_4$ | 3 |
| | | | | | $H_2$ | 200 |
| | | | | | $PH_3$ | 0.6 |
| | Bottom photoelectric conversion layer | 200 | 133 | 30 | $SiH_4$ | 20 |
| | | | | | $H_2$ | 400 |
| | p-layer | 160 | 133 | 240 | $SiH_4$ | 10 |
| | | | | | $H_2$ | 2000 |
| | | | | | $B_2H_6$ | 0.2 |
| Front cell | n-layer | 160 | 133 | 100 | $SiH_4$ | 3 |
| | | | | | $H_2$ | 200 |
| | | | | | $PH_3$ | 0.6 |
| | Front photoelectric conversion layer | 160 | 400 | 30 | $SiH_4$ | 30 |
| | | | | | $H_2$ | 150 |
| | p-layer | 160 | 33 | 240 | $SiH_4$ | 10 |
| | | | | | $H_2$ | 90 |
| | | | | | $CH_4$ | 10 |
| | | | | | $B_2H_6$ | 0.4 |

As shown in Table 9 and Table 10, reaction pressure and high-frequency power at the time of formation of the front photoelectric conversion layer 8 in the inventive example 3 were made lower than those in the comparative example 3. $H_2$ serving as a diluent gas was not introduced at the time of formation of the front photoelectric conversion layer 8 in the inventive example 3, while $H_2$ serving as a diluent gas was introduced at the time of formation of the front photoelectric conversion layer 8 in the comparative example 3.

The respective initial characteristics of the stacked photovoltaic devices in the inventive example 3 and the comparative example 3 were measured under conditions such as AM-1.5, 100 mW/cm², and 25° C. Thereafter, the stacked photovoltaic device in each of the inventive example 3 and the comparative example 3 was divided into two parts. One of the parts was used for evaluating characteristics after light irradiation, described later. In order to evaluate the concentration of oxygen as the concentration of impurities in each of the bottom photoelectric conversion layer 5 and the front photoelectric conversion layer 8, the other part was analyzed by an SIMS.

First, Table 11 shows the results of the analysis by the SIMS.

TABLE 11

| | Concentration of impurities (oxygen) in front photoelectric conversion layer [atom/cm³] | Concentration of impurities (oxygen) in bottom photoelectric conversion layer [atom/cm³] |
|---|---|---|
| Inventive example 3 | $5 \times 10^{18}$ | $7 \times 10^{18}$ |
| Comparative example 3 | $8 \times 10^{18}$ | $7 \times 10^{18}$ |

As shown in Table 11, the concentration of oxygen in the bottom photoelectric conversion layer 5 in the inventive example 3 is approximately equal to that in the comparative example 3, while the concentration of oxygen in the front photoelectric conversion layer 8 in the inventive example 3 is lower than that in the comparative example 3. Thus, the concentration of oxygen in the bottom photoelectric conversion layer 5 is higher than the concentration of oxygen in the front photoelectric conversion layer 8 in the inventive example 3. On the other hand, the concentration of oxygen in the bottom photoelectric conversion layer 5 is lower than the concentration of oxygen in the front photoelectric conversion layer 8 in the comparative example 3.

The results have shown that the concentration of oxygen in the front photoelectric conversion layer 8 can be controlled by adjusting the formation conditions of the front photoelectric conversion layer 8.

Furthermore, in order to evaluate the conversion efficiency after stabilization by light irradiation for a long time period, light was irradiated for 160 minutes toward the respective other parts of the stacked photovoltaic devices in the inventive example 1 and the comparative example 3 under conditions such as AM-1.5, 500 mW/cm², 25° C., and an opened state between terminals. Standardized output characteristics were calculated by dividing the value of the output characteristics after light irradiation by the value of the initial characteristics before light irradiation. Table 12 shows the standardized conversion efficiency, standardized open-circuit voltage, standardized short-circuit current, and standardized fill factor as the standardized output characteristics.

TABLE 12

| | Standardized conversion efficiency | Standardized open-circuit voltage | Standardized short-circuit current | Standardized fill factor |
|---|---|---|---|---|
| Inventive example 3 | 0.87 | 0.98 | 0.98 | 0.91 |
| Comparative example 3 | 0.81 | 0.99 | 0.98 | 0.84 |

As shown in Table 4, it is found that the light degradation factor in the inventive example 3 is lower than that in the comparative example 3. The reason for this is considered as follows.

That is, the light degradation of the bottom photoelectric conversion layer 5 can be brought close to the light degradation of the front photoelectric conversion layer 8 by making the concentration of oxygen in the bottom photoelectric conversion layer 5 higher than the concentration of oxygen in the front photoelectric conversion layer 8, so that the light degradation of the bottom photoelectric conversion layer 5 and the light degradation of the front photoelectric conversion layer 8 are balanced. Therefore, the fill factor (F.F.) after light irradiation is kept high. Since the bottom photoelectric conversion layer 5 is composed of microcrystalline silicon, the light degradation thereof is inherently very little. In the stacked photovoltaic device, the bottom cell 200 and the front cell 300 are connected in series. In the comparative example 3, therefore, the balance between the output characteristics of the front cell 300 and the output characteristics of the bottom cell 200 is disrupted as the fill factor of the front cell 300 is reduced. Therefore, it is considered that the fill factor of the whole stacked photovoltaic device was degraded. Contrary to this, in the inventive example 3, the output characteristics of the front cell 300 and the output characteristics of the bottom cell 200 are balanced, so that it is considered that the fill factor of the whole stacked photovoltaic device was also kept relatively high.

As a result of these, the output characteristics after the light degradation of the stacked photovoltaic device can be kept high by making the concentration of oxygen in the bottom photoelectric conversion layer 5 higher than the concentration of oxygen in the front photoelectric conversion layer 8.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A stacked photovoltaic device having a light incidence surface, comprising
    a plurality of photovoltaic cells stacked and each including
        a photoelectric conversion layer composed of a substantially intrinsic semiconductor, said plurality of photovoltaic cells including a first photovoltaic cell closest to the light incidence surface and at least a second photovoltaic cell,
    the photoelectric conversion layer in the first photovoltaic cell closest to the light incidence surface including an amorphous semiconductor, and the photoelectric conversion layer in said second photovoltaic cell including a non-single crystalline semiconductor containing crystal grains, and
    the concentration of impurities contained in the photoelectric conversion layer in said second photovoltaic cell being higher than the concentration of impurities contained in the photoelectric conversion layer in said first photovoltaic cell.

2. The photovoltaic device according to claim 1, wherein
said non-single crystalline semiconductor is a microcrystalline semiconductor containing crystal grains having a diameter of not more than 1 μm.

3. The photovoltaic device according to claim 1, wherein
said impurities include carbon, the concentration of carbon contained in the photoelectric conversion layer in said second photovoltaic cell being higher than the concentration of carbon contained in the photoelectric conversion layer in said first photovoltaic cell.

4. The photovoltaic device according to claim 1, wherein
said impurities include nitrogen, the concentration of nitrogen contained in the photoelectric conversion layer in said second photovoltaic cell being higher than the concentration of nitrogen contained in the photoelectric conversion layer in said first photovoltaic cell.

5. The photovoltaic device according to claim 1, wherein
said impurities include oxygen, the concentration of oxygen contained in the photoelectric conversion layer in said second photovoltaic cell being higher than the concentration of oxygen contained in the photoelectric conversion layer in said first photovoltaic cell.

6. A method of manufacturing a stacked photovoltaic device, comprising the steps of:
    forming a plurality of photovoltaic cells in order, each comprising a photoelectric conversion layer composed of a substantially intrinsic semiconductor, said plurality of photovoltaic cells including a first photovoltaic cell closest to the light incidence surface and at least a second photovoltaic cell,
    the photoelectric conversion layer in the first photovoltaic cell including an amorphous semiconductor, and the photoelectric conversion layer in the second photovoltaic cell including a non-single crystalline semiconductor containing crystal grains; and
    adjusting at least one of the formation condition of the photoelectric conversion layer in said first photovoltaic cell and the formation condition of the photoelectric conversion layer in said second photovoltaic cell such that the concentration of impurities contained in the photoelectric conversion layer in said second photovoltaic cell is higher than the concentration of impurities contained in the photoelectric conversion layer in said first photovoltaic cell.

7. The method according to claim 6, wherein
said non-single crystalline semiconductor is a microcrystalline semiconductor containing crystal grains having a diameter of not more than 1 μm.

8. The method according to claim 6, wherein
said impurities include carbon, and
said adjusting step comprises the step of adjusting at least one of the formation condition of the photoelectric conversion layer in said first photovoltaic cell and the formation condition of the photoelectric conversion layer in said second photovoltaic cell such that the concentration of carbon contained in the photoelectric conversion layer in said second photovoltaic cell is higher than the concentration of carbon contained in the photoelectric conversion layer in said first photovoltaic cell.

9. The method according to claim 6, wherein
said impurities include nitrogen, and
said adjusting step comprises the step of adjusting at least one of the formation condition of the photoelectric conversion layer in said first photovoltaic cell and the formation condition of the photoelectric conversion layer in said second photovoltaic cell such that the concentration of nitrogen contained in the photoelectric conversion layer in said second photovoltaic cell is higher than the concentration of nitrogen contained in the photoelectric conversion layer in said first photovoltaic cell.

10. The method according to claim 6, wherein
said impurities include oxygen, and
said adjusting step comprises the step of adjusting at least one of the formation condition of the photoelectric conversion layer in said first photovoltaic cell and the formation condition of the photoelectric conversion layer in said second photovoltaic cell such that the concentration of oxygen contained in the photoelectric conversion layer in said second photovoltaic cell is higher than the concentration of oxygen contained in the photoelectric conversion layer in said first photovoltaic cell.

* * * * *